United States Patent
Araki (10) Patent No.: US 11,405,021 B2
(45) Date of Patent: Aug. 2, 2022

(54) FILTER DEVICE AND MULTIPLEXER

(71) Applicant: Murata Manufacturing Co., Ltd., Nagaokakyo (JP)

(72) Inventor: Masato Araki, Nagaokakyo (JP)

(73) Assignee: MURATA MANUFACTURING CO., LTD.452644, Kyoto (JP)

( * ) Notice: Subject to any disclaimer, the term of this patent is extended or adjusted under 35 U.S.C. 154(b) by 245 days.

(21) Appl. No.: 16/898,585

(22) Filed: Jun. 11, 2020

(65) Prior Publication Data

US 2020/0304104 A1 Sep. 24, 2020

Related U.S. Application Data (63) Continuation of application No. PCT/CN2019/051129, filed on Dec. 26, 2019.

(30) Foreign Application Priority Data

Dec. 28, 2018 (JP) .............................. JP2018-247153

(51) Int. Cl.
*H03H 9/64* (2006.01)
*H03H 9/25* (2006.01)
*H03H 9/72* (2006.01)

(52) U.S. Cl.
CPC ............ *H03H 9/6489* (2013.01); *H03H 9/25* (2013.01); *H03H 9/6483* (2013.01); *H03H 9/72* (2013.01)

(58) Field of Classification Search
CPC ............... H03H 9/25; H03H 9/64; H03H 9/72
See application file for complete search history.

(56) References Cited

U.S. PATENT DOCUMENTS

| | | | | |
|---|---|---|---|---|
| 6,131,257 A * | 10/2000 | Nishihara | ............ | H03H 9/1071 |
| | | | | 29/25.35 |
| 7,345,400 B2 * | 3/2008 | Nakao | ................ | H03H 9/02559 |
| | | | | 333/195 |
| 7,956,511 B2 * | 6/2011 | Kadota | .............. | H03H 9/02559 |
| | | | | 310/313 B |
| 8,598,968 B2 * | 12/2013 | Seo | ...................... | H03H 9/0222 |
| | | | | 333/195 |

(Continued)

FOREIGN PATENT DOCUMENTS

| JP | 2005-295496 A | 10/2005 |
|---|---|---|
| JP | 2012-169707 A | 9/2012 |

(Continued)

OTHER PUBLICATIONS

Official Communication issued in International Patent Application No. PCT/JP2019/051129, dated Mar. 3, 2020.

*Primary Examiner* — Dean O Takaoka
*Assistant Examiner* — Alan Wong
(74) *Attorney, Agent, or Firm* — Keating & Bennett, LLP (57) ABSTRACT

A filter device includes a filter circuit that is connected to terminals, is defined by a first acoustic wave resonator that has a first frequency band as a pass band, and an additional circuit that is connected in parallel to at least one first acoustic wave resonator between the terminal and the terminal. The additional circuit is defined by a second acoustic wave resonator in which an electromechanical coupling coefficient of the additional circuit is different from an electromechanical coupling coefficient of the filter circuit.

16 Claims, 8 Drawing Sheets

(56) References Cited

U.S. PATENT DOCUMENTS

| | | | |
|---|---|---|---|
| 8,981,872 B2* | 3/2015 | Klamm | H03H 9/725 |
| | | | 333/195 |
| 9,118,303 B2* | 8/2015 | Inoue | H03H 9/6483 |
| 9,240,768 B2* | 1/2016 | Nishihara | H03H 9/02834 |
| 9,641,151 B2* | 5/2017 | Ikeuchi | H03H 9/02559 |
| 10,333,484 B2* | 6/2019 | Komatsu | H03H 9/6409 |
| 10,476,482 B2* | 11/2019 | Niwa | H03H 9/605 |
| 10,979,028 B2* | 4/2021 | Komatsu | H03H 9/02559 |
| 2008/0067891 A1 | 3/2008 | Matsuda et al. | |
| 2009/0224852 A1 | 9/2009 | Shibahara | |
| 2011/0204998 A1 | 8/2011 | Seo et al. | |
| 2012/0200371 A1 | 8/2012 | Yamashita | |
| 2013/0113576 A1 | 5/2013 | Inoue et al. | |
| 2017/0331456 A1 | 11/2017 | Ono | |
| 2018/0069529 A1 | 3/2018 | Bi et al. | |
| 2018/0131349 A1 | 5/2018 | Takata | |
| 2019/0267970 A1 | 8/2019 | Nosaka | |

FOREIGN PATENT DOCUMENTS

| | | | |
|---|---|---|---|
| JP | 2013-118611 A | 6/2013 | |
| JP | 2017-204743 A | 11/2017 | |
| JP | 2018-038040 A | 3/2018 | |
| JP | 2018-074539 A | 5/2018 | |
| KR | 10-2008-0026061 A | 3/2008 | |
| KR | 10-2008-0028427 A | 3/2008 | |
| WO | 2018/097203 A1 | 5/2018 | |

* cited by examiner

FIG. 7B

FILTER DEVICE AND MULTIPLEXER

CROSS REFERENCE TO RELATED APPLICATIONS

This application claims the benefit of priority to Japanese Patent Application No. 2018-247153 filed on Dec. 28, 2018 and is a Continuation Application of PCT Application No. PCT/JP2019/051129 filed on Dec. 26, 2019. The entire contents of each application are hereby incorporated herein by reference.

BACKGROUND OF THE INVENTION

1. Field of the Invention

The present invention relates to a filter device and a multiplexer.

2. Description of the Related Art

In recent years, mobile phones are required to cope with a plurality of frequency bands and a plurality of wireless systems, that is, multiple bands and multiple modes, by one terminal. To cope with this, in one filter device, an enhancement of the attenuation characteristics of the frequency band corresponding to the pass band of another filter device is required.

Japanese Unexamined Patent Application Publication No. 2013-118611 discloses a circuit configuration of a duplexer including a demultiplexer and an additional circuit. The demultiplexer includes a transmission-side filter circuit and a reception-side filter circuit. The additional circuit is configured by a longitudinally-coupled acoustic wave resonator and an electrostatic capacity, and generates a cancellation component having an opposite phase and an identical amplitude with respect to a component of a predetermined frequency band flowing through the transmission-side filter circuit. According to the above configuration, it is possible to improve isolation characteristics of the demultiplexer and attenuation characteristics of the transmission-side filter circuit without increasing the insertion loss.

In the transmission-side filter circuit described in Japanese Unexamined Patent Application Publication No. 2013-118611, in a case where a wide frequency band needs to be attenuated, for example, a configuration in which a plurality of additional circuits having different predetermined frequency bands are arranged is exemplified. However, in this case, the transmission-side filter circuit is increased in size. On the other hand, in a case of securing steepness at an end portion of a pass band of the transmission-side filter circuit, a configuration in which a capacitive element is connected in parallel to a resonator in the additional circuit to attenuate a narrow frequency band is exemplified. However, also in this case, an increase in the size of the transmission-side filter circuit due to an addition of the capacitive element and a deterioration in a Q-value of the transmission-side filter circuit due to a conductance factor of the capacitive element become a problem.

SUMMARY OF THE INVENTION

Preferred embodiments of the present invention provide compact filter devices and multiplexers having a high attenuation characteristic corresponding to a bandwidth of an attenuation band.

A filter device according to a preferred embodiment of the present invention includes a first terminal and a second terminal, a first filter circuit that is connected to the first terminal and the second terminal, that includes a first acoustic wave resonator, and that has a first frequency band as a pass band, and an additional circuit that is connected in parallel to at least the one first acoustic wave resonator between the first terminal and the second terminal. The additional circuit includes a second acoustic wave resonator, and an electromechanical coupling coefficient of the additional circuit is different from an electromechanical coupling coefficient of the first filter circuit.

According to preferred embodiments of the present invention, it is possible to provide compact filter devices and multiplexers each having a high attenuation characteristic corresponding to a bandwidth of an attenuation band.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Hereinafter, preferred embodiments of the present invention will be described in detail with reference to examples and the drawings. Note that all examples described below indicate comprehensive or specific examples. Numerical values, shapes, materials, elements, arrangement and connection configurations of the elements, and the like, which will be described in the following examples, are mere examples and are not intended to limit the present invention. Among the elements in the following examples, elements not described in independent claims are described as arbitrary or optional elements. In addition, sizes or size ratios of the elements illustrated in the drawings are not necessarily strict.

PREFERRED EMBODIMENT

Figure 1:
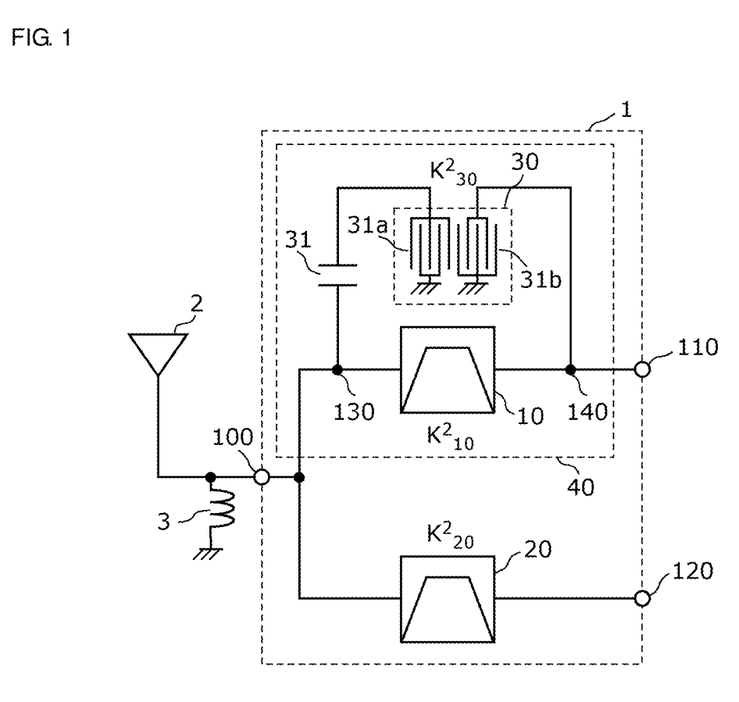
FIG. 1 is a circuit configuration diagram of a filter device, a multiplexer, and peripheral circuits thereof according to a preferred embodiment of the present invention.

1. Circuit Configuration of Filter Device 40 and Multiplexer 1 FIG. 1 is a circuit configuration diagram of a filter device 40, a multiplexer 1, and peripheral circuits thereof according to a preferred embodiment of the present invention. In FIG. 1, the multiplexer 1, an antenna 2, and a matching inductor 3 according to the preferred embodiment are illustrated.

The multiplexer 1 includes the filter device 40, a filter circuit 20, a common terminal 100, and input/output terminals 110 and 120. The filter device 40 and the filter circuit 20 are connected to the common terminal 100 in common.

The filter device 40 includes a filter circuit 10, an additional circuit 30, a capacitor 31, a terminal 130 (first terminal), and a terminal 140 (second terminal).

The terminal 130 is provided on a path connecting the common terminal 100 and the input/output terminal 110, and is provided on the common terminal 100 side among the common terminal 100 and the input/output terminal 110. The terminal 140 is provided on the path connecting the common terminal 100 and the input/output terminal 110, and is provided on the input/output terminal 110 side among the common terminal 100 and the input/output terminal 110. Note that the terminals 130 and 140 may be nodes (contacts) connecting a wiring and a wiring.

The filter circuit 10 is a first filter circuit that is connected to the terminals 130 and 140, is preferably defined by a first acoustic wave resonator, and has a first frequency band as a pass band. The filter circuit 10 is preferably, for example, a ladder surface acoustic wave filter including a plurality of surface acoustic wave resonators or a longitudinally-coupled surface acoustic wave filter.

The additional circuit 30 is connected to the terminals 130 and 140 (with the capacitor 31 interposed therebetween), is preferably defined by a second acoustic wave resonator, and generates a signal having a phase opposite to a signal component in a predetermined frequency band other than the first frequency band passing through the filter circuit 10. In other words, the additional circuit 30 cancels a high-frequency signal in a predetermined frequency band other than the first frequency band passing through the filter circuit 10. That is, the additional circuit 30 is connected in parallel to at least one first acoustic wave resonator between the terminal 130 and the terminal 140, and includes the second acoustic wave resonator. The additional circuit 30 is preferably, for example, a longitudinally-coupled surface acoustic wave resonator or a surface acoustic wave filter including one or more surface acoustic wave resonators, or a transversal resonator or a transversal filter. In the present preferred embodiment, the additional circuit 30 is a longitudinally-coupled resonator, and includes two surface acoustic wave resonators 31a and 31b, in which one end (surface acoustic wave resonator 31a) is connected to one end of the capacitor 31, and another end (surface acoustic wave resonator 31b) is connected to the terminal 140. Another end of the capacitor 31 is connected to the terminal 130. As a configuration of the additional circuit 30, it is preferable to use a longitudinally-coupled resonator that is advantageous in a low-loss of only a predetermined frequency band as compared to the other frequency bands in a wide band.

In addition, the "cancelling a high-frequency signal in a predetermined frequency band" corresponds to a cancellation signal component generated by the additional circuit 30 and a cancellation signal component of the cancellation target (for example, in the reception band) among the signals transmitted through the filter circuit 10 being summed, and an amplitude of the summation result is smaller than an amplitude of an original cancellation target signal component. More preferably, the cancellation signal component generated by the additional circuit is a signal having an opposite phase and an identical or substantially identical amplitude with respect to the signal component of the cancellation target after passing through the filter circuit 10.

Here, the fact that phases of the signal component of the cancellation target and the cancellation signal component are opposite to each other means that an absolute value of a phase difference between the both signal components is larger than 90° in a range of equal to or more than −180° to equal to or less than 180°. This is equivalent to the fact that the signal component of the cancellation target and the cancellation signal have phase components in mutually opposite directions.

Further, it is preferable that the cancellation signal have the same or substantially the same amplitude as that of the signal component of the cancellation target, but the amplitude of the cancellation signal may be different from that of the cancellation target signal component. According to the phase difference between the cancellation signal and the cancellation target signal component, in a case where the amplitude of the summation result of the cancellation signal and the cancellation target signal component becomes smaller than the amplitude of the original cancellation target signal component, it is possible to improve attenuation characteristics of the filter device 40.

The capacitor 31 is connected between the terminal 130 and the additional circuit 30. The capacitor 31 cancels the high-frequency signal with high accuracy in the predetermined frequency band passing through the filter circuit 10 by the high-frequency signal (cancellation signal) in a predetermined frequency band passing through the additional circuit 30. Further, the capacitor 31 can ensure impedance matching between the filter circuit 10 and the additional circuit 30. Note that the capacitor 31 may also be omitted if so desired. Additionally, in order to achieve the impedance matching between the filter circuit 10 and the additional circuit 30, a capacitor may also be connected between the terminal 140 and the additional circuit 30.

Here, in the filter device 40 according to the present preferred embodiment, an electromechanical coupling coefficient $K^2_{30}$ of the additional circuit 30 is different from an electromechanical coupling coefficient $K^2_{10}$ of the filter circuit 10.

In a filter device having a configuration in which a filter circuit and an additional circuit are connected in parallel, for example, a configuration in which a plurality of additional circuits having different predetermined frequency bands are arranged is exemplified in a case where a frequency band having a bandwidth equal to or greater than a pass band of the filter circuit is attenuated widely. However, in this case, the circuit of the filter device is made to be increased in size. On the other hand, in a case of ensuring steepness at the pass band end portion of the filter circuit, a configuration in which a capacitive element is connected in parallel to a resonator in the additional circuit is exemplified. However, also in this case, an increase in size of the filter device due to an addition of the capacitive element and a deterioration in a Q-value of the filter device caused by a conductance factor of the capacitive element become a problem.

In contrast, according to the above configuration of the filter device 40 according to the present preferred embodiment, since the electromechanical coupling coefficient $K^2_{30}$ of the additional circuit 30 and the electromechanical coupling coefficient $K^2_{10}$ of the filter circuit 10 are made to be different from each other, for example, in a case where the frequency band having the bandwidth equal to or greater than the pass band of the filter circuit 10 is widely attenuated, the electromechanical coupling coefficient $K^2_{30}$ of the additional circuit 30 is set to be larger than the electromechanical coupling coefficient $K^2_{10}$ of the filter circuit 10. On the other hand, in a case where the steepness at the pass band end portion of the filter circuit 10 is secured, the electromechanical coupling coefficient $K^2_{30}$ of the additional circuit 30 is set to be smaller than the electromechanical coupling coefficient $K^2_{10}$ of the filter circuit 10. This makes it possible to provide a small filter device 40 having a high attenuation characteristic corresponding to the bandwidth of the attenuation band of the filter circuit 10 and a frequency interval between the attenuation band and the pass band of the filter circuit 10.

The filter circuit 20 is a second filter circuit that is connected to the common terminal 100 and the input/output terminal 120, and that has a second frequency band different from the first frequency band, as a pass band. Note that magnitude relationship between the frequencies of the first frequency band and the second frequency band may be any relationship in grade.

According to the above-described configuration of the multiplexer 1 according to the preferred embodiment, for example, in a case where the second frequency band having a bandwidth equal to or greater than the pass band of the filter circuit 10 is widely attenuated, the electromechanical coupling coefficient $K^2_{30}$ of the additional circuit 30 is set to be larger than the electromechanical coupling coefficient $K^2_{10}$ of the filter circuit 10, for example. On the other hand, in a case where the steepness at the pass band end portion of the filter circuit 10 is secured, the electromechanical coupling coefficient $K^2_{30}$ of the additional circuit 30 is set to be smaller than the electromechanical coupling coefficient $K^2_{10}$ of the filter circuit 10. Accordingly, the filter device 40 can widely attenuate the second frequency band or greatly attenuate a portion of the second frequency band without increasing an insertion loss of the passband end portion, thus reducing the insertion loss of bandpass characteristics of the filter circuit 20. Therefore, it is possible to improve the bandpass characteristics of the multiplexer 1.

Note that in the present preferred embodiment, the filter device 40 is preferably a transmission filter that preferentially outputs from the common terminal 100 a high-frequency signal in the first frequency band among the high-frequency signals input from the input/output terminal 110. Further, the filter circuit 20 is preferably a reception filter that preferentially outputs from the input/output terminal 120 a high-frequency signal in the second frequency band among the high-frequency signals input from the common terminal 100.

With this configuration, the multiplexer 1 defines and functions as a duplexer that outputs the high-frequency signal received by the antenna 2, from the input/output terminal 120 via the common terminal 100 and the filter circuit 20, and outputs the high-frequency signal input from the input/output terminal 110 to the antenna 2 via the filter circuit 10 and the common terminal 100.

Note that, in the multiplexer according to preferred embodiments of the present invention, the filter device 40 and the filter circuit 20 may be a transmission filter and a reception filter. In addition, the number of filters connected to the common terminal 100 is not limited to two.

Note that an amplification circuit to amplify a high-frequency signal, a high-frequency signal processing circuit (RFIC), and the like are preferably connected to the input/output terminals 110 and 120. Further, the common terminal 100 does not need to be connected to the antenna 2, and may be connected to the antenna 2 with a switch circuit interposed therebetween.

The matching inductor 3 is connected between the antenna 2 and the common terminal 100, and performs the impedance matching between the antenna 2 and the multiplexer 1. Note that an impedance matching element connected between the antenna 2 and the common terminal 100 is not limited to the matching inductor 3. Further, the matching inductor 3 may be arranged between the common terminal 100 and the filter circuits 10 and 20.

2. Basic Configuration of Acoustic Wave Resonator

Hereinafter, a basic structure of the acoustic wave resonators configuring the filter circuits 10 and 20, and the additional circuit 30 will be described.

Figure 2A:
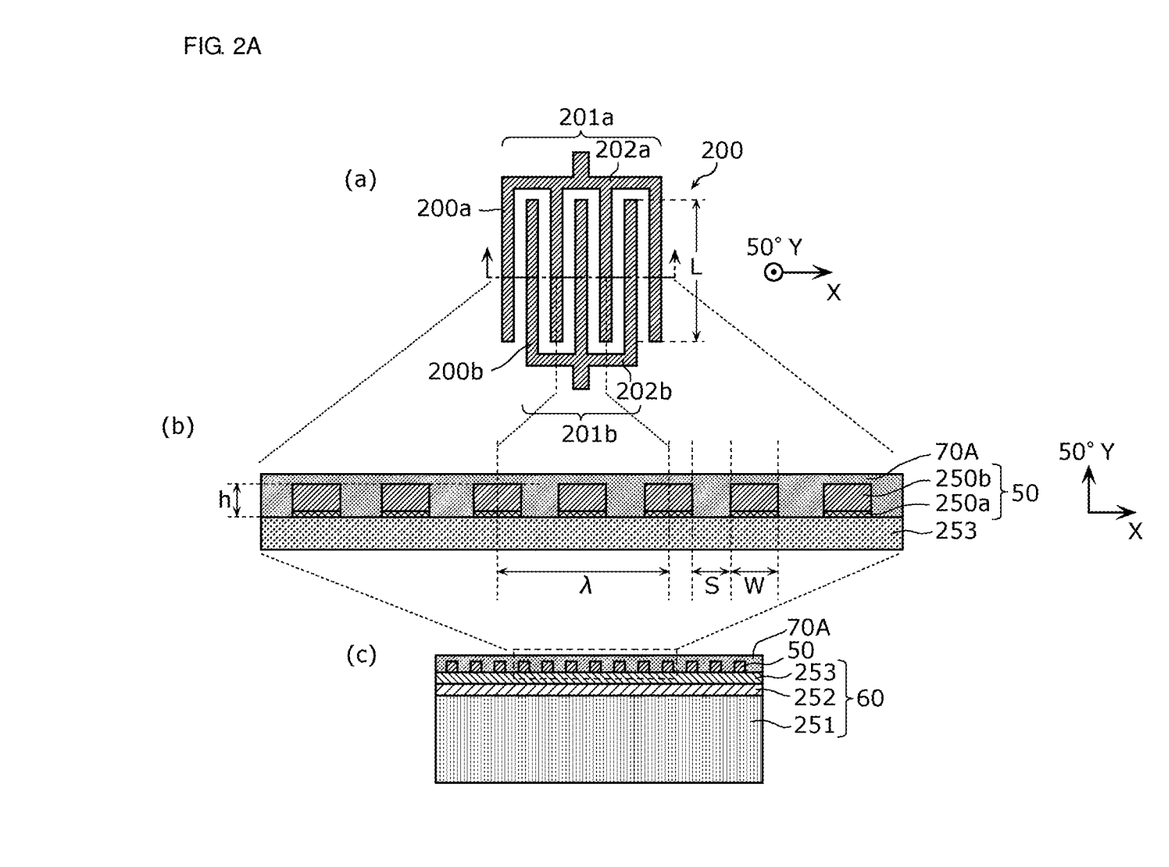
FIG. 2A is a schematic diagram schematically illustrating an example of an acoustic wave resonator according to a preferred embodiment of the present invention.

FIG. 2A is a schematic view schematically illustrating an example of an acoustic wave resonator according to a preferred embodiment of the present invention, and part (a) is a plan view, and parts (b) and (c) are cross-sectional views taken along a dash-dotted line illustrated in part (a). FIG. 2A illustrates a schematic plan view and a schematic cross-sectional view indicating the basic structure of the acoustic wave resonator of the filter circuit 10. Note that, part (a) of FIG. 2A is a view explaining a typical structure of an interdigital transducer (IDT) electrode defining the acoustic wave resonator, and the number, the length, an electrode finger pitch, and the like of electrode fingers of the electrode are not limited to the configuration illustrated in FIG. 2A.

The acoustic wave resonator 200 includes a substrate 60 having a piezoelectricity and comb-shaped electrodes 201a and 201b.

As illustrated in part (a) of FIG. 2A, a pair of comb-shaped electrodes 201a and 201b facing each other are provided on the substrate 60. The comb-shaped electrode 201a includes a plurality of electrode fingers 200a that are parallel or substantially parallel to one another and a busbar electrode 200a that connects one ends of the plurality of electrode fingers 202a to one another. Further, the comb-shaped electrode 201b includes a plurality of electrode fingers 200b that are parallel or substantially parallel to one another and a busbar electrode 200b that connects one ends of the plurality of electrode fingers 202b to one another. The plurality of electrode fingers 200a and 200b extend along a direction orthogonal or substantially orthogonal to an acoustic wave propagation direction (X-axis direction).

Further, as illustrated in part (b) of FIG. 2A, the interdigital transducer electrode 50 including the plurality of electrode fingers 200a and 200b and the busbar electrodes 202a and 202b preferably has a laminated structure of a close contact layer 250a and a main electrode layer 250b.

The close contact layer 250a is a layer that improves a close contact property between the substrate 60 and the main electrode layer 250b, and for example, Ti (titanium) is preferably used as a material. A film thickness of the close contact layer 250a is preferably, for example, about 12 nm.

As the main electrode layer 250b, for example, Al including 1% Cu (copper) is preferably used as a material. A film thickness of the main electrode layer 250b is preferably, for example, about 162 nm.

A dielectric layer 70A covers the comb-shaped electrodes 201a and 201b. The dielectric layer 70A is a layer intended to protect the main electrode layer 250b from an external environment, to adjust frequency temperature characteristics, to improve moisture resistance, and the like, for example, and mainly contains $SiO_2$ (silicon dioxide) as a main component. A thickness of the dielectric layer 70A is preferably, for example, about 25 nm.

Note that materials defining the close contact layer 250a, the main electrode layer 250b, and the dielectric layer 70A are not limited to those described above. Further, the interdigital transducer electrode 50 may not have the above-described laminated structure. The interdigital transducer electrode 50 may be made of, for example, a metal or an alloy such as Ti, Al (aluminum), Cu, Pt (platinum), Au (gold), Ag (silver), Pd (palladium), or the like, or may be configured by a plurality of multilayer bodies made of the above-described metal or alloy. Further, the dielectric layer 70A may alternatively not be provided, if so desired.

Next, a laminated structure of the substrate 60 will be described.

As illustrated in part (c) of FIG. 2A, the substrate 60 preferably includes a high acoustic velocity support substrate 251, a low acoustic velocity film 252, and a piezoelectric film 253, and has a structure in which the high acoustic velocity support substrate 251, the low acoustic velocity film 252, and the piezoelectric film 253 are laminated in this order.

The piezoelectric film 253 is preferably made of, for example, a 50° Y-cut X-propagation $LiTaO_3$ (lithium tantalate) piezoelectric single crystal or piezoelectric ceramics (a lithium tantalate single crystal obtained by cutting along a plane using an axis being rotated by about 50° from a Y-axis using the X-axis as a central axis, served as a normal line, or ceramics, namely, a single crystal or ceramics in which a surface acoustic wave propagates in the X-axis direction). The piezoelectric film 253 preferably has, for example, a thickness of about 600 nm. Note that, depending on required specifications of each of the filters, materials and cut angles of the piezoelectric single crystal to be used as the piezoelectric film 253 are appropriately selected.

The high acoustic velocity support substrate 251 is a substrate that supports the low acoustic velocity film 252, the piezoelectric film 253, and the interdigital transducer electrode 50. Further, the high acoustic velocity support substrate 251 is a substrate in which an acoustic velocity of a bulk wave in the high acoustic velocity support substrate 251 becomes higher than that of the acoustic waves such as a surface acoustic wave, a boundary wave and the like propagating through the piezoelectric film 253, and functions to confine the surface acoustic wave in a portion where the piezoelectric film 253 and the low acoustic velocity film 252 are laminated, and to prevent the surface acoustic wave from leaking to a lower side relative to the high acoustic velocity support substrate 251. The high acoustic velocity support substrate 251 is preferably, for example, a silicon substrate, and preferably has a thickness of, for example, about 200 μm.

The low acoustic velocity film 252 is a film in which an acoustic velocity of a bulk wave in the low acoustic velocity film 252 is lower than that of a bulk wave propagating through the piezoelectric film 253, and is arranged between the piezoelectric film 253 and the high acoustic velocity support substrate 251. The structure and such an essential property of the acoustic wave that energy concentrates on a medium having a low acoustic velocity reduce leakage of surface acoustic wave energy to an outside of an interdigital transducer electrode. The low acoustic velocity film 252 is preferably, for example, a film including silicon dioxide as a main component, and has preferably a thickness of, for example, about 670 nm.

Note that, according to the above-described laminated structure of the substrate 60, the Q-value at a resonant frequency and an anti-resonant frequency can be significantly increased as compared to the existing structure in which the piezoelectric substrate includes a single layer. That is, since an acoustic wave resonator having a high Q-value can be provided, it is possible to configure a filter having a low insertion loss by using the acoustic wave resonator.

Note that the high acoustic velocity support substrate 251 may include a structure in which a support substrate and a high acoustic velocity film in which the acoustic velocity of the bulk wave propagating becomes higher than that of the acoustic waves such as the surface acoustic wave, the boundary wave and the like propagating through the piezoelectric film 253 are laminated. In this case, the support substrate may be made by using a piezoelectric body such as lithium tantalate (lithium tantalate), lithium niobate (lithium niobate), quartz, or the like, various ceramics such as alumina, magnesia, silicon nitride, aluminum nitride, silicon carbide, zirconia, cordierite, mullite, steatite, forsterite, or the like, a dielectric such as sapphire, glass or the like, a semiconductor such as silicon and gallium nitride or the like and resin substrate or the like. As the high acoustic velocity film, various high acoustic velocity materials can be used, such as aluminum nitride, aluminum oxide, silicon carbide, silicon nitride, silicon oxynitride, DLC film or diamond, a medium including the above-mentioned material as a main component, a medium including a mixture of the above materials as a main component, or the like.

Figure 2B:
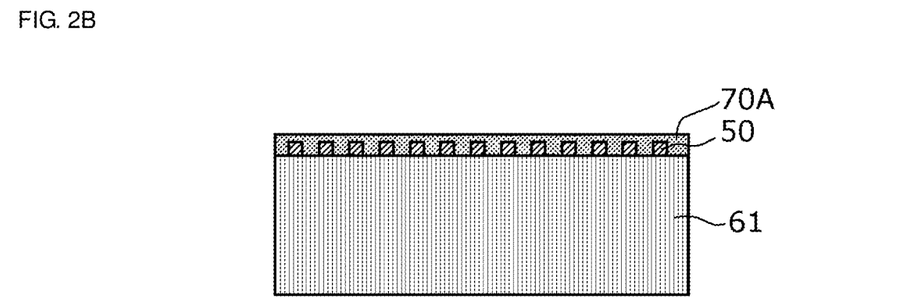
FIG. 2B is a cross-sectional view schematically illustrating an acoustic wave resonator according to a first modification of a preferred embodiment of the present invention.

In addition, FIG. 2B is a cross-sectional view schematically illustrating an acoustic wave resonator according to a first modification of the preferred embodiment. In the acoustic wave resonator 200 illustrated in FIG. 2A, an example in which the interdigital transducer electrode 50 is on the substrate 60 including the piezoelectric film 253 has been described, but the substrate on which the interdigital transducer electrode 50 is provided may be a piezoelectric single crystal substrate 61 made of a single layer of the piezoelectric layer as illustrated in FIG. 2B. The piezoelectric single crystal substrate 61 is preferably made of, for example, a piezoelectric single crystal of $LiNbO_3$ (lithium niobate). The acoustic wave resonator 200 according to the modification includes a piezoelectric single crystal substrate 61, an interdigital transducer electrode 50, and a dielectric layer 70A on the piezoelectric single crystal substrate 61 and on the interdigital transducer electrode 50.

In the piezoelectric film 253 and the piezoelectric single crystal substrate 61 described above, the laminated structure, the material, the cut angle, and the thickness may be appropriately changed depending on required bandpass characteristics of the filter circuits 10 and 20 and the additional circuit 30. Even in the acoustic wave resonator 200 using a $LiTaO_3$ piezoelectric substrate or the like having a cut angle other than the cut angle described above, the same or similar advantageous effects as those of the acoustic wave resonator 200 including the piezoelectric film 253 described above can be obtained.

3. Structure for Adjusting Electromechanical Coupling Coefficient_$K^2_{30} > K^2_{10}$ Next, a structure of the acoustic wave resonator to adjust the electromechanical coupling coefficients of the filter circuits 10 and 20, and the additional circuit 30 will be described.

The acoustic wave resonators defining the filter circuit and the additional circuit 30 according to the preferred embodiment are preferably surface acoustic wave resonators.

Figure 3A:
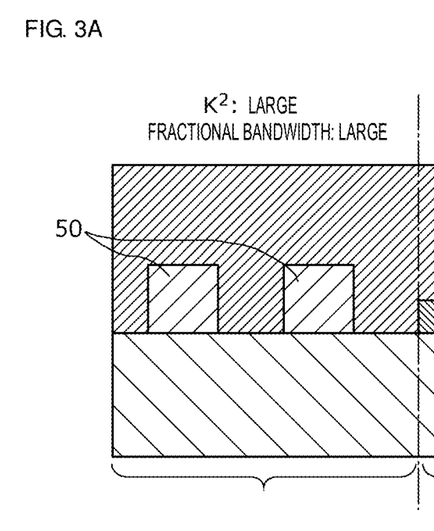
FIGS. 3A and 3B are schematic cross-sectional views explaining a first configuration for adjusting an electromechanical coupling coefficient of the acoustic wave resonator according to a preferred embodiment of the present invention.
Figure 3B:
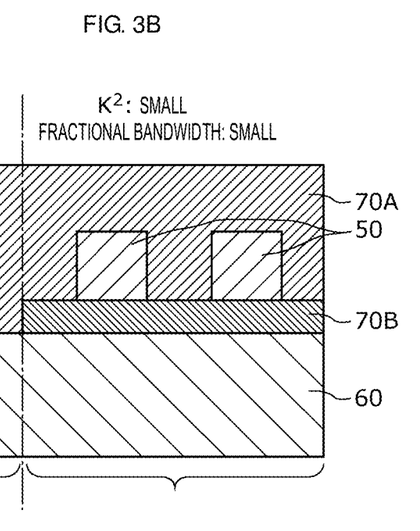
Figure 4A:
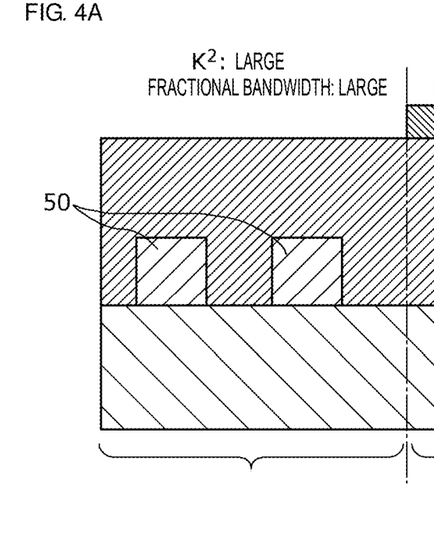
FIGS. 4A and 4B are schematic cross-sectional views explaining a second configuration for adjusting the electromechanical coupling coefficient of the acoustic wave resonator according to a preferred embodiment of the present invention.
Figure 4B:
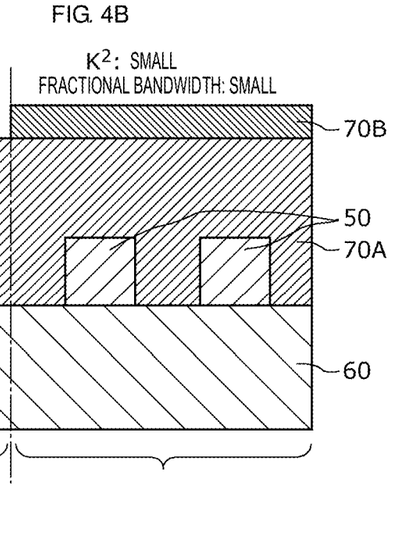

FIGS. 3A and 3B are schematic cross-sectional views explaining a first configuration that adjusts the electromechanical coupling coefficient of the acoustic wave resonator according to the preferred embodiment. Further, FIGS. 4A and 4B are schematic cross-sectional views explaining a second configuration to adjust the electromechanical coupling coefficient of the acoustic wave resonator according to the preferred embodiment. FIGS. 3A and 3B and FIGS. 4A and 4B illustrate a cross-sectional structure of a portion of the acoustic wave resonator defining the filter circuit 10 and the additional circuit 30. Note that the cross-sectional structures illustrated in FIGS. 3A and 3B and FIGS. 4A and 4B explain a typical structure of a portion of the acoustic wave resonator, and the thickness of respective layers, the number and the length of the interdigital transducer electrodes, and the like are not limited thereto.

The first acoustic wave resonator defining the filter circuit 10 preferably includes, for example, a cross-sectional structure in FIG. 3B, and the second acoustic wave resonator defining the additional circuit 30 preferably includes, for example, a cross-sectional structure in FIG. 3A.

More specifically, as illustrated in FIG. 3B, the first acoustic wave resonator includes the substrate 60 (first piezoelectric body) and the interdigital transducer electrode 50 (first interdigital transducer electrode), and a dielectric layer 70B (first dielectric layer) that is between the substrate 60 and the interdigital transducer electrode 50 and adjusts the electromechanical coupling coefficient. As illustrated in FIG. 3A, the second acoustic wave resonator includes the substrate 60 (second piezoelectric body) and the interdigital transducer electrode 50 (second interdigital transducer electrode) that is in contact with the substrate 60.

The substrate 60 is preferably includes, for example, the high acoustic velocity support substrate 251, the low acoustic velocity film 252, and the piezoelectric film 253, which are described above. In addition, the substrate 60 may be the piezoelectric single crystal substrate 61 described above. The piezoelectric single crystal substrate 61 may be made of, for example, a LiTaO$_3$ piezoelectric single crystal, a KNbO$_3$ piezoelectric single crystal, quartz crystal, or piezoelectric ceramics.

The dielectric layers 70A and 70B preferably include, for example, SiO$_2$ as a main component. In addition, the dielectric layers 70A and 70B may be made of a dielectric or an insulating material such as, for example, SiN, AlN, polyimide, or a multilayer body thereof.

According to the above-described configuration, the electromechanical coupling coefficient $K^2_{30}$ of the additional circuit 30 is larger than the electromechanical coupling coefficient $K^2_{10}$ of the filter circuit 10.

Note that the first acoustic wave resonator defining the filter circuit 10 and the second acoustic wave resonator defining the additional circuit 30 may each have a cross-sectional structure in FIG. 3B. That is, as illustrated in FIG. 3B, the first acoustic wave resonator includes the substrate 60 (first piezoelectric body) and the interdigital transducer electrode 50 (first interdigital transducer electrode), and the dielectric layer 70B (first dielectric layer) that is between the substrate 60 and the interdigital transducer electrode 50 and adjusts the electromechanical coupling coefficient. Further, as illustrated in FIG. 3B, the second acoustic wave resonator preferably includes the substrate 60 (second piezoelectric body) and the interdigital transducer electrode 50 (second interdigital transducer electrode), and the dielectric layer 70B (second dielectric layer) that is between the substrate 60 and the interdigital transducer electrode 50 and adjusts the electromechanical coupling coefficient. Here, the dielectric layer 70B (second dielectric layer) defining the second acoustic wave resonator is preferably thinner than the dielectric layer 70B (first dielectric layer) configuring the first acoustic wave resonator.

Even with this configuration, the electromechanical coupling coefficient $K^2_{30}$ of the additional circuit 30 is larger than the electromechanical coupling coefficient $K^2_{10}$ of the filter circuit 10.

Further, the first acoustic wave resonator that defines the filter circuit 10 preferably has, for example, a cross-sectional structure in FIG. 4B, and the second acoustic wave resonator that defines the additional circuit 30 preferably has, for example, a cross-sectional structure in FIG. 4A.

More specifically, as illustrated in FIG. 4B, the first acoustic wave resonator includes the substrate 60 (first piezoelectric body) and the interdigital transducer electrode 50 (first interdigital transducer electrode), and a multilayer body (third dielectric layer) including the dielectric layers 70A and 70B that covers the interdigital transducer electrode 50 and adjusts the electromechanical coupling coefficient. Further, as illustrated in FIG. 4A, the second acoustic wave resonator includes the substrate 60 (second piezoelectric body) and the interdigital transducer electrode 50 (second interdigital transducer electrode), and the dielectric layer 70A (fourth dielectric layer) that covers the interdigital transducer electrode 50 and adjusts the electromechanical coupling coefficient. Here, the dielectric layer 70A (fourth dielectric layer) defining the second acoustic wave resonator is preferably thinner than the multilayer body (third dielectric layer) of the dielectric layers 70A and 70B configuring the first acoustic wave resonator.

Even with this configuration, the electromechanical coupling coefficient $K^2_{30}$ of the additional circuit 30 is larger than the electromechanical coupling coefficient $K^2_{10}$ of the filter circuit 10.

Figure 5A:
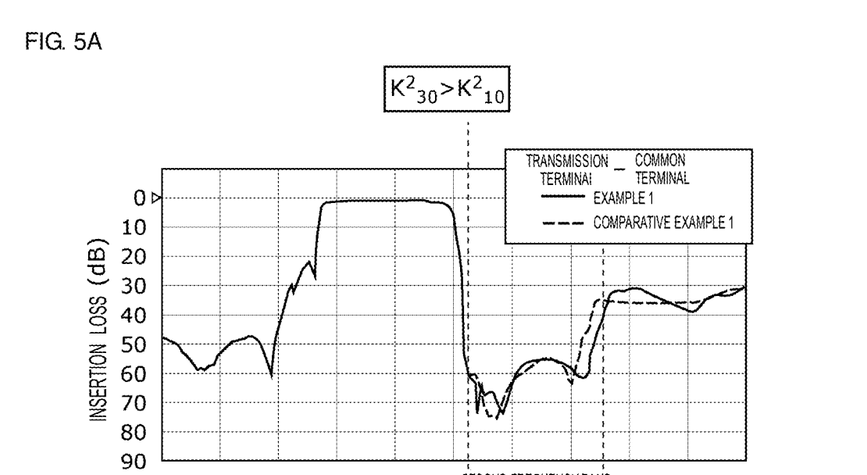
FIGS. 5A and 5B include graphs comparing bandpass characteristics of filter devices and isolation characteristics of multiplexers according to a first example of a preferred embodiment of the present invention and a first comparative example, respectively.
Figure 5B:
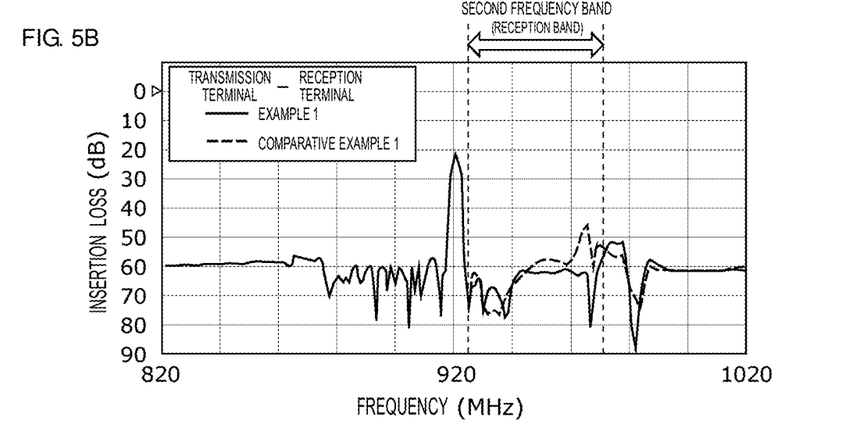

FIGS. 5A and 5B include graphs comparing the bandpass characteristics of the filter devices and isolation characteristics of the multiplexers according to a first example of a preferred embodiment of the present invention and a first comparative example. In FIG. 5A, the bandpass characteristics between the input/output terminal 110 and the common terminal 100 of the filter device 40 are illustrated. Further, in FIG. 5B, the isolation characteristics between the input/output terminals 110 and 120 of the multiplexer 1 in which the filter device 40 and the filter circuit 20 are connected in common are illustrated.

Note that, in the filter device 40 according to the first example, the configuration of the first acoustic wave resonator included in the filter circuit 10 is regarded as the configuration illustrated in FIG. 3B, and the configuration of the second acoustic wave resonator included in the additional circuit 30 is regarded as the configuration illustrated in FIG. 3A. Further, the filter circuit 10 is a ladder surface acoustic wave filter including a plurality of first acoustic wave resonators, and the additional circuit 30 is a longitudinally-coupled surface acoustic wave resonator including a plurality of second acoustic wave resonators.

Additionally, the filter device according to the first comparative example differs from the filter device 40 according to the first example only in that also the configuration of the first acoustic wave resonator included in the filter circuit 10 is regarded as the configuration illustrated in FIG. 3A, similarly to the configuration of the second acoustic wave resonator included in the additional circuit 30.

In addition, the example and the comparative example have a circuit configuration in which the second frequency band is higher than the first frequency band, that is, the pass band of the filter circuit 20 is higher than the pass band of the filter circuit 10.

In the first example and the first comparative example, the additional circuit 30 allows a high-frequency signal in the second frequency band to pass therethrough in substantially the opposite phase to the high-frequency signal of the second frequency band passing through the filter circuit 10.

Further, in the first example, since the electromechanical coupling coefficient $K^2_{30}$ of the additional circuit 30 is larger than the electromechanical coupling coefficient $K^2_{10}$ of the filter circuit 10, the high-frequency signal of the second frequency band is made to pass through the additional circuit 30 in a relatively wide band. Therefore, as illustrated in FIG. 5A, the filter device 40 according to the first example improves attenuation in the pass band (second frequency band) of the filter circuit 20, as compared to the filter device according to the first comparative example.

That is, with the filter device 40 according to the first example, since the electromechanical coupling coefficient $K^2_{30}$ of the additional circuit 30 is larger than the electromechanical coupling coefficient $K^2_{10}$ of the filter circuit 10, such frequency band having a bandwidth equal to or greater than the pass band of the filter circuit 10 can be attenuated widely.

In addition, as illustrated in FIG. 5B, the filter device according to the first example improves the isolation in substantially the entire second frequency band of the multiplexer as compared to the filter device according to the first comparative example.

That is, with the multiplexer 1 according to the first example, since the electromechanical coupling coefficient $K^2_{30}$ of the additional circuit 30 is larger than the electromechanical coupling coefficient $K^2_{10}$ of the filter circuit 10, it is possible to improve the isolation in the pass band of the filter circuit 20, and thus it is possible to reduce an insertion loss of the pass band of the filter circuit 20.

4. Structure for Adjusting Electromechanical Coupling Coefficient_$K^2_{30}<K^2_{10}$ The first acoustic wave resonator defining the filter circuit 10 preferably includes, for example, a cross-sectional structure in FIG. 3A, and the second acoustic wave resonator defining the additional circuit 30 preferably includes, for example, a cross-sectional structure in FIG. 3B.

More specifically, as illustrated in FIG. 3B, the second acoustic wave resonator includes the substrate 60 (second piezoelectric body) and the interdigital transducer electrode 50 (second interdigital transducer electrode), and the dielectric layer 70B (second dielectric layer) that is between the substrate 60 and the interdigital transducer electrode 50 and adjusts the electromechanical coupling coefficient. Further, as illustrated in FIG. 3A, the first acoustic wave resonator includes the substrate 60 (first piezoelectric body) and the interdigital transducer electrode 50 (first interdigital transducer electrode) that is in contact with the substrate 60.

According to the above-described configuration, the electromechanical coupling coefficient $K^2_{30}$ of the additional circuit 30 becomes smaller than the electromechanical coupling coefficient $K^2_{10}$ of the filter circuit 10.

Note that the first acoustic wave resonator defining the filter circuit 10 and the second acoustic wave resonator defining the additional circuit 30 may each have a cross-sectional structure in FIG. 3B. That is, as illustrated in FIG. 3B, the second acoustic wave resonator preferably includes the substrate 60 (second piezoelectric body) and the interdigital transducer electrode 50 (second interdigital transducer electrode), and the dielectric layer 70B (second dielectric layer) that is between the substrate 60 and the interdigital transducer electrode 50 and adjusts the electromechanical coupling coefficient. As illustrated in FIG. 3B, the first acoustic wave resonator preferably includes the substrate 60 (first piezoelectric body) and the interdigital transducer electrode 50 (first interdigital transducer electrode), and the dielectric layer 70B (first dielectric layer) that is between the substrate 60 and the interdigital transducer electrode 50 and adjusts the electromechanical coupling coefficient. Here, the dielectric layer 70B (second dielectric layer) defining the second acoustic wave resonator is preferably thicker than the dielectric layer 70B (first dielectric layer) defining the first acoustic wave resonator.

Even with this configuration, the electromechanical coupling coefficient $K^2_{30}$ of the additional circuit 30 becomes smaller than the electromechanical coupling coefficient $K^2_{10}$ of the filter circuit 10.

Further, the first acoustic wave resonator defining the filter circuit 10 preferably includes, for example, a cross-sectional structure in FIG. 4A, and the second acoustic wave resonator defining the additional circuit 30 preferably includes, for example, a cross-sectional structure in FIG. 4B.

More specifically, as illustrated in FIG. 4B, the second acoustic wave resonator preferably includes the substrate 60 (second piezoelectric body) and the interdigital transducer electrode 50 (second interdigital transducer electrode), and the multilayer body (fourth dielectric layer) of the dielectric layers 70A and 70B that covers the interdigital transducer electrode 50 and adjusts the electromechanical coupling coefficient. Further, as illustrated in FIG. 4A, the first acoustic wave resonator preferably includes the substrate 60 (first piezoelectric body) and the interdigital transducer electrode 50 (first interdigital transducer electrode), and the dielectric layer 70A (third dielectric layer) that covers the interdigital transducer electrode 50 and adjusts the electromechanical coupling coefficient. Here, the multilayer body (fourth dielectric layer) of the dielectric layers 70A and 70B defining the second acoustic wave resonator is thicker than the dielectric layer 70A (third dielectric layer) configuring the first acoustic wave resonator.

Even with this configuration, the electromechanical coupling coefficient $K^2_{30}$ of the additional circuit 30 becomes smaller than the electromechanical coupling coefficient $K^2_{10}$ of the filter circuit 10.

Figure 6A:
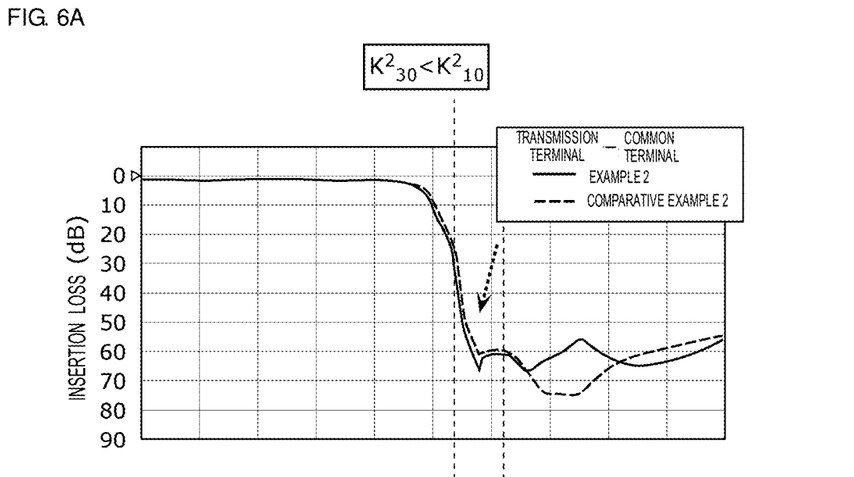
FIGS. 6A and 6B include graphs comparing bandpass characteristics of filter devices and isolation characteristics of multiplexers according to a second example of a preferred embodiment of the present invention and a second comparative example, respectively.
Figure 6B:
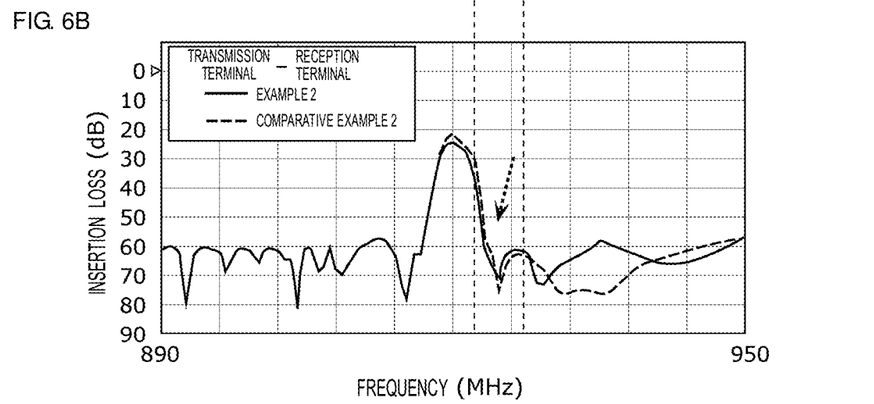

FIGS. 6A and 6B include graphs comparing the bandpass characteristics of the filter devices and the isolation characteristics of the multiplexers according to a second example of a preferred embodiment of the present invention and a second comparative example. In FIG. 6A, the bandpass characteristics between the input/output terminal 110 and the common terminal 100 of the filter device 40 are illustrated. In FIG. 6B, the isolation characteristics between the input/output terminals 110 and 120 of the multiplexer 1 in which the filter device 40 and the filter circuit 20 are connected in common are illustrated.

Note that, in the filter device 40 according to the second example, the configuration of the first acoustic wave resonator included in the filter circuit 10 is the configuration illustrated in FIG. 3A, and the configuration of the second acoustic wave resonator included in the additional circuit 30 is the configuration illustrated in FIG. 3B. Further, the filter circuit 10 is a ladder surface acoustic wave filter including a plurality of first acoustic wave resonators, and the additional circuit 30 is a longitudinally-coupled surface acoustic wave resonator including a plurality of second acoustic wave resonators.

Additionally, the filter device according to the second comparative example preferably differs from the filter device 40 according to the second example only in that also the configuration of the second acoustic wave resonator included in the additional circuit 30 is the configuration illustrated in FIG. 3A, similarly to the configuration of the first acoustic wave resonator included in the filter circuit 10.

In addition, the example and the comparative example include a circuit configuration in which the second frequency band is higher than the first frequency band, that is, the pass band of the filter circuit 20 is higher than the pass band of the filter circuit 10.

In the second example and the second comparative example, the additional circuit 30 allows the high-frequency signal on the high-frequency side relative to the first frequency band to pass therethrough in substantially the opposite phase to the high-frequency signal on the high-frequency side passing through the filter circuit 10.

Further, in the second example, since the electromechanical coupling coefficient $K^2_{30}$ of the additional circuit 30 is smaller than the electromechanical coupling coefficient $K^2_{10}$ of the filter circuit 10, the additional circuit 30 allows the high-frequency signal of a narrow band close to the first frequency band of the second frequency band, to pass therethrough. Accordingly, as illustrated in FIG. 6A, the filter device 40 according to the second example improves the steepness in the vicinity of a high-frequency side end portion of the pass band of the filter circuit 10 without increasing the insertion loss at the high-frequency side end portion, as compared to the filter device according to the second comparative example. In other words, the attenuation on the low frequency side of the pass band (the second frequency band) of the filter circuit 20 is improved in the narrow band without increasing the insertion loss at a high frequency end of the pass band of the filter circuit 10.

That is, according to the filter device 40 according to the second example, since the electromechanical coupling coefficient $K^2_{30}$ of the additional circuit 30 is smaller than the electromechanical coupling coefficient $K^2_{10}$ of the filter circuit 10, it is possible to rapidly attenuate the frequency band having a narrower bandwidth than that of the pass band of the filter circuit 10.

In addition, as illustrated in FIG. 6B, the filter device 40 according to the second example improves the isolation in the second frequency band of the multiplexer 1 by only a portion on the low frequency side of the second frequency band close to the first frequency band, as compared to the filter device according to the second comparative example.

That is, according to the multiplexer 1 according to the second example, since the electromechanical coupling coefficient $K^2_{30}$ of the additional circuit 30 is smaller than the electromechanical coupling coefficient $K^2_{10}$ of the filter circuit 10, it is possible to improve the isolation on the pass band low frequency side of the filter circuit 20, and thus it is possible to reduce the insertion loss on the pass band low frequency side of the filter circuit 20.

Note that, in the above-described first and second examples, as for the attenuation band of the filter circuit 10, by regarding a pass band (second frequency band) of the filter circuit 20 connected to the common terminal 100 as a target, an improvement effect in the above-described attenuation band has been described. That is, the high-frequency signal that is made to pass through the additional circuit 30 is regarded as the signal in the second frequency band. However, the frequency band of the high-frequency signal that is made to pass through the additional circuit 30 is not limited to the second frequency band, and may be any frequency band other than the pass band (first frequency band) of the filter circuit 10.

Note that in the first and second examples, the substrate 60 of the filter circuit 10 (first piezoelectric body) and the substrate 60 of the additional circuit 30 (second piezoelectric body) may be one continuous piezoelectric body. That is, the filter circuit 10 and the additional circuit 30 may be provided on a common substrate.

In order to adjust the electromechanical coupling coefficient, as illustrated in FIGS. 3A and 3B and FIGS. 4A and 4B, the configurations are such that the dielectric layers on the substrate and the interdigital transducer electrode are present or not, or the dielectric layers have different thicknesses. These configurations can be obtained, for example, by partial etching on the substrate in a manufacturing process by using the same substrate, and therefore, an electrode layout area of the filter device 40 can be reduced by a simplified process. This makes it possible to reduce the size of the filter device 40 and the multiplexer 1.

5. Modification of Multiplexer

Figure 7A:
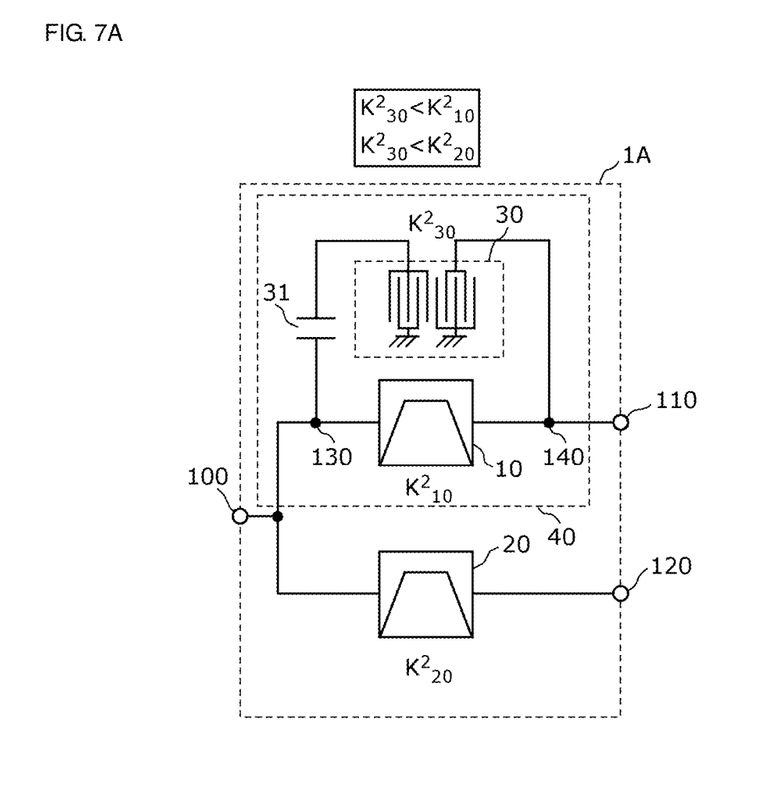
FIG. 7A is a circuit configuration diagram of a multiplexer according to a second modification of a preferred embodiment of the present invention.

FIG. 7A is a circuit configuration diagram of a multiplexer 1A according to a second modification of the preferred embodiment. As illustrated in FIG. 7A, the multiplexer 1A according to the modification preferably includes the filter device 40, the filter circuit 20, the common terminal 100, and the input/output terminals 110 and 120. The multiplexer 1A according to the modification preferably includes the same circuit configuration as the multiplexer 1 according to the preferred embodiment, but the filter connected to the common terminal 100 is limited to two filters, namely the filter device 40 and the filter circuit 20. That is, a filter other than the filter device 40 and the filter circuit 20 is not connected to the common terminal 100.

Further, the electromechanical coupling coefficient $K^2_{30}$ of the additional circuit 30 is smaller than the electromechanical coupling coefficient $K^2_{10}$ of the filter circuit 10, and is smaller than an electromechanical coupling coefficient $K^2_{20}$ of the filter circuit 20.

In a case of the above-described configuration, the filter connected to the common terminal 100 is preferably defined by only the filter circuit 20 except the filter device 40. Therefore, a band for which high attenuation is required in the filter device 40 is often only the pass band (a portion) of the filter circuit 20.

Therefore, in such a case, since the narrow band may be attenuated in the filter device 40, the electromechanical coupling coefficient $K^2_{30}$ of the additional circuit 30 is set to be smaller than the electromechanical coupling coefficient $K^2_{10}$ of the filter circuit 10 and to be smaller than the electromechanical coupling coefficient $K^2_{20}$ of the filter circuit 20. Note that in the modification, the electromechanical coupling coefficient $K^2_{30}$ of the additional circuit 30 need not smaller than the electromechanical coupling coefficient $K^2_{20}$ of the filter circuit 20.

Figure 7B:
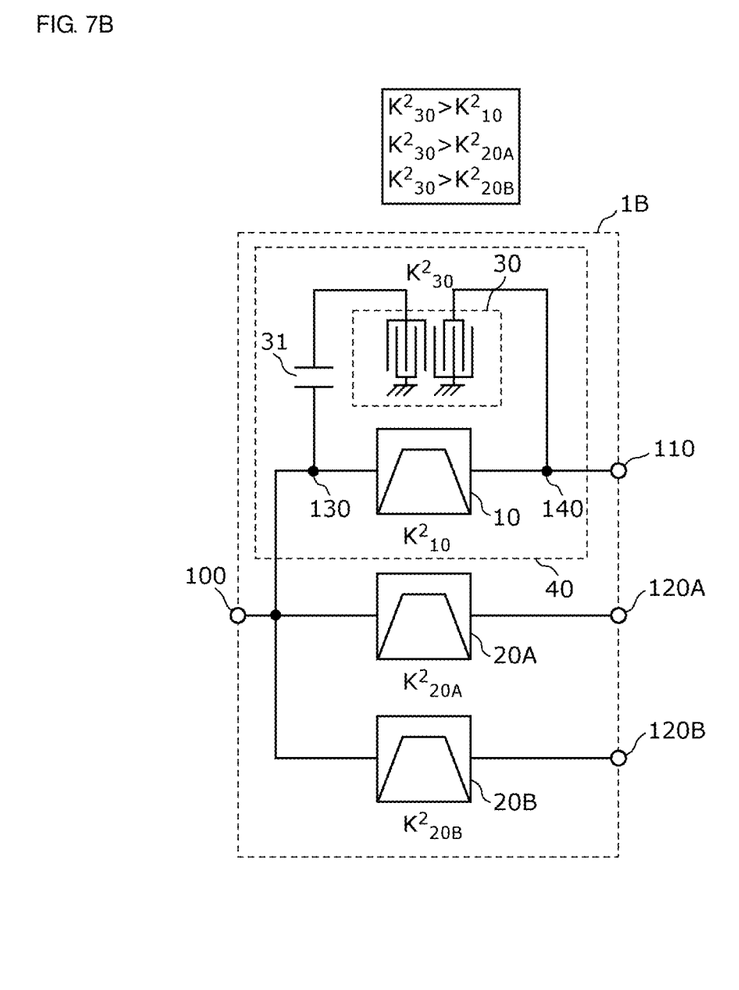
FIG. 7B is a circuit configuration diagram of a multiplexer according to a third modification of a preferred embodiment of the present invention.

FIG. 7B is a circuit configuration diagram of a multiplexer 1B according to a third modification of the preferred embodiment. As illustrated FIG. 7B, the multiplexer 1B according to the present modification includes the filter device 40, filter circuits 20A and 20B, the common terminal 100, and the input/output terminal 110 and input/output terminals 120A and 120B. The multiplexer 1B according to the present modification differs from the multiplexer 1A according to the second modification in that a third filter circuit 20B is added.

Further, the electromechanical coupling coefficient $K^2_{30}$ of the additional circuit 30 is larger than the electromechanical coupling coefficient $K^2_{10}$ of the filter circuit 10, is larger than an electromechanical coupling coefficient $K^2_{20A}$ of the filter circuit 20A, and is larger than an electromechanical coupling coefficient $K^2_{20B}$ of the filter circuit 20B.

The filter circuit 20A is the second filter circuit that is connected to the common terminal 100 and the input/output terminal 120A, and that has the second frequency band different from the first frequency band, as a pass band.

The filter circuit 20B is a third filter circuit that is connected to the common terminal 100 and the input/output terminal 120B, and that has a third frequency band, as a pass band, different from the first frequency band and the second frequency band and positioned between the first frequency band and the second frequency band.

In a case of the above configuration, the filter connected to the common terminal 100 is preferably defined by two filter circuits 20A and 20B except the filter device 40. The pass band of the filter device 40 is not positioned between the pass band of the filter circuit 20A and the pass band of the filter circuit 20B, but the pass band of the filter circuit 20A and the pass band of the filter circuit 20B are biasedly positioned closer to the high-frequency side or the low frequency side than the pass band of the filter device 40. Therefore, the band for which the high attenuation is required in the filter device 40 is often a wide band including the pass band of the filter circuit 20A and the pass band of the filter circuit 20B.

Therefore, in such a case, since it is necessary to attenuate a wide band in the filter device 40, the electromechanical coupling coefficient $K^2_{30}$ of the additional circuit 30 is set to be larger than the electromechanical coupling coefficient $K^2_{10}$ of the filter circuit 10, to be larger than the electromechanical coupling coefficient $K^2_{20A}$ of the filter circuit 20A, and to be larger than the electromechanical coupling coefficient $K^2_{20B}$ of the filter circuit 20B. Note that in the modification, the electromechanical coupling coefficient $K^2_{30}$ of the additional circuit 30 need not be larger than the electromechanical coupling coefficient $K^2_{20A}$ of the filter circuit 20A, and the electromechanical coupling coefficient $K^2_{30}$ of the additional circuit 30 need not be larger than the electromechanical coupling coefficient $K^2_{20B}$ of the filter circuit 20B.

According to the multiplexers according to the second modification and the third modification, it is possible to provide a small filter device and a multiplexer having a high attenuation characteristic corresponding to the bandwidth of the attenuation band.

OTHER PREFERRED EMBODIMENTS

As such, the filter devices and the multiplexers according to the present invention have been described above with reference to preferred embodiments and modifications thereof, but the filter devices and the multiplexers of the present invention are not limited to the above-described preferred embodiments and modifications thereof. Another preferred embodiment obtained by combining arbitrary elements in the above-described preferred embodiments, and various modifications that can be obtained by applying to the above-described preferred embodiment and modification thereof various modifications that can be conceived by those skilled in the art without departing from the scope of the present invention, as well as, various types of devices incorporating the filter device and the multiplexer of the present invention are also included in the present invention.

Note that, in the above-described preferred embodiments, "an electromechanical coupling coefficient of A is different from an electromechanical coupling coefficient of B" excludes that an electromechanical coupling coefficient of A and the electromechanical coupling coefficient of B are substantially the same, and means that fractional bandwidths (%) of A and B are different from each other by equal to or more than about 0.5 points.

In addition, in the above preferred embodiments and modifications thereof, the electromechanical coupling coefficient refers to a parameter representing efficiency of inter-conversion of mechanical energy and electrical energy between the piezoelectric substrate and the interdigital transducer electrode formed thereon in the surface acoustic wave device. Therefore, in a case where electrical characteristics of the surface acoustic wave device are adjusted by the circuit elements externally attached to the surface acoustic wave device, it is defined that the electromechanical coupling coefficient is not adjusted.

In addition, in the filter devices and the multiplexers according to the preferred embodiments and modification thereof, an inductor or a capacitor may be connected between the elements. Note that the inductor may include a wiring inductor defined by a wiring connecting the respective constituent elements.

Preferred embodiments of the present invention can be widely used for communication apparatuses such as cellular phones, for example, as a low-loss and high-attenuation filter and a low-loss and high-isolation multiplexer that are applicable to a multiband frequency standard.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A filter device comprising:
    a first terminal and a second terminal;
    a first filter circuit connected to the first terminal and the second terminal, the first filter circuit including a first acoustic wave resonator which has a first frequency band as a pass band; and
    an additional circuit connected in parallel to at least the one first acoustic wave resonator between the first terminal and the second terminal, the additional circuit including a second acoustic wave resonator; wherein
    an electromechanical coupling coefficient of the additional circuit is different from an electromechanical coupling coefficient of the first filter circuit.

2. The filter device according to claim 1, wherein the electromechanical coupling coefficient of the additional circuit is larger than the electromechanical coupling coefficient of the first filter circuit.

3. The filter device according to claim 2, wherein
    the first acoustic wave resonator includes:
        a first piezoelectric body and a first interdigital transducer electrode; and
        a first dielectric layer provided between the first piezoelectric body and the first interdigital transducer electrode;

the second acoustic wave resonator includes:
- a second piezoelectric body; and
- a second interdigital transducer electrode in contact with the second piezoelectric body.

4. The filter device according to claim 3, wherein the first piezoelectric body and the second piezoelectric body are defined by one continuous piezoelectric body.

5. The filter device according to claim 2, wherein
the first acoustic wave resonator includes:
- a first piezoelectric body and a first interdigital transducer electrode; and
- a first dielectric layer that is provided between the first piezoelectric body and the first interdigital transducer electrode and adjusts an electromechanical coupling coefficient;

a second acoustic wave resonator includes:
- a second piezoelectric body and a second interdigital transducer electrode; and
- a second dielectric layer that is provided between the second piezoelectric body and the second interdigital transducer electrode and adjusts an electromechanical coupling coefficient; and the second dielectric layer is thinner than the first dielectric layer.

6. The filter device according to claim 2, wherein
the first acoustic wave resonator includes:
- a first piezoelectric body and a first interdigital transducer electrode; and
- a third dielectric layer that covers the first interdigital transducer electrode and adjusts an electromechanical coupling coefficient;

the second acoustic wave resonator includes:
- a second piezoelectric body and a second interdigital transducer electrode; and
- a fourth dielectric layer that covers the second interdigital transducer electrode and adjusts an electromechanical coupling coefficient; and the fourth dielectric layer is thinner than the third dielectric layer.

7. A multiplexer comprising:
a common terminal; and
the filter device according to claim 2, in which the first terminal is connected to the common terminal;
a second filter circuit connected to the common terminal and having a second frequency band different from the first frequency band, as a pass band; and
a third filter circuit connected to the common terminal and having a third frequency band that is different from the first frequency band and the second frequency band and is positioned between the first frequency band and the second frequency band, as a pass band.

8. The filter device according to claim 1, wherein the electromechanical coupling coefficient of the additional circuit is smaller than the electromechanical coupling coefficient of the first filter circuit.

9. The filter device according to claim 8, wherein
the first acoustic wave resonator includes:
- a first piezoelectric body; and
- a first interdigital transducer electrode in contact with the first piezoelectric body; and the second acoustic wave resonator includes:
- a second piezoelectric body and a second interdigital transducer electrode; and
- a second dielectric layer that is between the second piezoelectric body and the second interdigital transducer electrode and adjusts an electromechanical coupling coefficient.

10. The filter device according to claim 9, wherein the first piezoelectric body and the second piezoelectric body are defined by one continuous piezoelectric body.

11. The filter device according to claim 8, wherein
the first acoustic wave resonator includes:
- a first piezoelectric body and a first interdigital transducer electrode; and
- a first dielectric layer that is provided between the first piezoelectric body and the first interdigital transducer electrode and adjusts an electromechanical coupling coefficient;

the second acoustic wave resonator includes:
- a second piezoelectric body and a second interdigital transducer electrode; and
- a second dielectric layer that is provided between the second piezoelectric body and the second interdigital transducer electrode and adjusts an electromechanical coupling coefficient; and the second dielectric layer is thicker than the first dielectric layer.

12. The filter device according to claim 8,
the first acoustic wave resonator includes:
- a first piezoelectric body and a first interdigital transducer electrode; and
- a third dielectric layer that covers the first interdigital transducer electrode and adjusts an electromechanical coupling coefficient;

the second acoustic wave resonator includes:
- a second piezoelectric body and a second interdigital transducer electrode; and
- a fourth dielectric layer that covers the second interdigital transducer electrode and adjusts an electromechanical coupling coefficient; and the fourth dielectric layer is thicker than the third dielectric layer.

13. A multiplexer comprising:
a common terminal;
the filter device according to claim 8, in which the first terminal is connected to the common terminal; and
a second filter circuit connected to the common terminal and having a second frequency band different from the first frequency band, as a pass band; wherein
the common terminal is not connected to any filter other than the filter device and the second filter circuit.

14. A multiplexer comprising:
a common terminal;
the filter device according to claim 1, in which the first terminal is connected to the common terminal; and
a second filter circuit connected to the common terminal and having a second frequency band different from the first frequency band, as a pass band.

15. The filter device according to claim 1, wherein
the first filter circuit is a ladder surface acoustic wave filter defined by a plurality of surface acoustic wave resonators or a longitudinally-coupled surface acoustic wave filter; and
the additional circuit is defined by a second acoustic wave resonator which generates a signal having a phase opposite to a signal component in a predetermined frequency band other than the first frequency band.

16. The filter device according to claim 1, wherein a capacitor is connected in series between the first filter circuit and the additional filter circuit.

* * * * *